(12) United States Patent
Endo et al.

(10) Patent No.: US 7,726,012 B2
(45) Date of Patent: Jun. 1, 2010

(54) COMPONENT-MOUNTING APPARATUS AND COMPONENT-POSITIONING UNIT HAVING ROLLER MEMBER WITH SLOPED POSITIONING SURFACE

(75) Inventors: Hiroki Endo, Kyoto-fu (JP); Teruki Nishi, Kyoto-fu (JP)

(73) Assignee: Murata Manufacturing Co., Ltd. (JP)

( * ) Notice: Subject to any disclaimer, the term of this patent is extended or adjusted under 35 U.S.C. 154(b) by 793 days.

(21) Appl. No.: 10/576,837

(22) PCT Filed: May 16, 2005

(86) PCT No.: PCT/JP2005/008854

§ 371 (c)(1),
(2), (4) Date: Apr. 10, 2006

(87) PCT Pub. No.: WO2005/112536

PCT Pub. Date: Nov. 24, 2005

(65) Prior Publication Data

US 2008/0244899 A1     Oct. 9, 2008

(30) Foreign Application Priority Data

May 17, 2004   (JP)   ............................. 2004-147043

(51) Int. Cl.
*B23P 19/00*   (2006.01)
(52) U.S. Cl. .............................. 29/740; 29/719; 29/741; 29/742; 29/834; 414/752.1
(58) Field of Classification Search ........... 29/740–743, 29/833–834, 719–722; 228/180.21–180.22; 356/614; 382/151; 414/752.1, 751.2–751.7
See application file for complete search history.

(56) References Cited

U.S. PATENT DOCUMENTS

| | | | | | |
|---|---|---|---|---|---|
| 5,255,429 | A | * | 10/1993 | Nishi et al. | ................... 29/720 |
| 5,908,282 | A | * | 6/1999 | Onodera | ..................... 414/783 |

(Continued)

FOREIGN PATENT DOCUMENTS

JP   03-026428   2/1991

(Continued)

OTHER PUBLICATIONS

International Search Report PCT/JP2004/013111 dated Dec. 21, 2004.

(Continued)

*Primary Examiner*—Minh Trinh
(74) *Attorney, Agent, or Firm*—Ostrolenk Faber LLP (57) ABSTRACT

A component-mounting apparatus and a component-positioning unit for positioning a component, having a simple structure with reduced manufacturing cost and a significantly higher component-mounting speed. The component-mounting apparatus includes a holding device that holds a component and moves horizontally and a positioning device having a sloped portion for positioning the component held by the holding device when the component comes into contact with the sloped portion. The positioning device comprises a first rotatable roller member having a sloped side surface with which the component comes into contact; and the horizontal movement speed of the holding device substantially agrees with the horizontal component of the peripheral velocity of the first roller member, with which the component comes into contact.

5 Claims, 5 Drawing Sheets

U.S. PATENT DOCUMENTS 6,729,018 B1 * 5/2004 Takano et al. .................. 29/743
6,973,713 B1 * 12/2005 Huber et al. .................. 29/740

FOREIGN PATENT DOCUMENTS

| | | |
|---|---|---|
| JP | 05-063398 | 3/1993 |
| JP | 08-203949 | 8/1996 |
| JP | 2000-133993 | 5/2000 |
| JP | 2002-203709 | 7/2002 |

OTHER PUBLICATIONS

Korean Office Action issued Feb. 22, 2007.

* cited by examiner

PERIPHERAL VELOCITY OF SLOPED ROLLER

COMPONENT-MOUNTING APPARATUS AND COMPONENT-POSITIONING UNIT HAVING ROLLER MEMBER WITH SLOPED POSITIONING SURFACE

CROSS-REFERENCE TO RELATED APPLICATION

The present application is a 35 U.S.C. §371 national phase conversion of PCT/JP2005/008854 filed May 16, 2005, which claims priority of Japanese application no. 2004-147043 filed May 17, 2004, which are incorporated herein in their entirety.

BACKGROUND OF THE INVENTION

1. Technical Field

The present invention relates to component-mounting apparatuses for positioning and mounting, for example, an electronic component on another electronic component and component-positioning units for positioning a component.

2. Background Art

Figure 8:
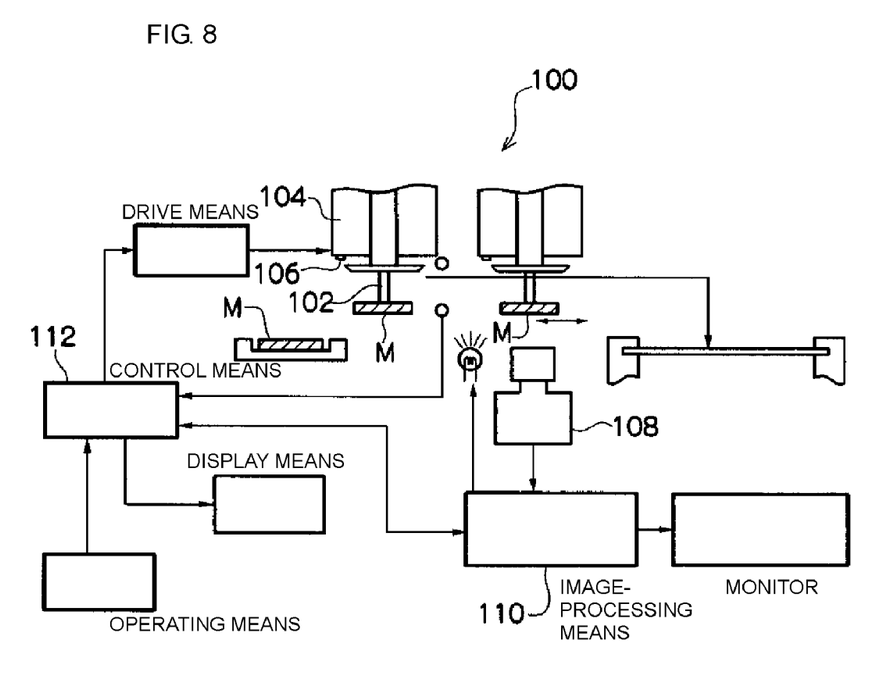
FIG. 8 is a schematic diagram of a known component-mounting apparatus.

Referring to FIG. 8, (Patent Document 1: Japanese Unexamined Patent Application Publication No. 5-63398) a known component-mounting apparatus 100 includes a moving head 104 that moves with a component M held by the suction of a nozzle 102, a reference mark 106 provided on the moving head 104, a camera 108 for taking an image of the moving head 104 moving with the component M held by the suction of the nozzle 102 and the reference mark 106, image-processing means 110 for detecting the position of the component M held by suction relative to the reference mark 106 according to the image information of the camera 108 and calculating the amount of deviation of the detected position of the component M held by suction based on the predetermined relative positions of the reference mark 106 and the nozzle 102, and control means 112 for adjusting the position of the moving head 104 to correct the amount of deviation before placing the component M at a predetermined position.

In this component-handling apparatus 100, the moving head 104 moves over the camera 108 with the component M held by the suction of the nozzle 102. Using the camera 108, the position of the component M held by suction is detected relative to the reference mark 106 provided on the moving head 104. The amount of deviation of the detected position of the component M held by suction is calculated based on the predetermined relative positions of the reference mark 106 and the nozzle 102. The position of the moving head 104 is then adjusted so that the amount of deviation is corrected before the component M is placed at a predetermined position. Hence, according to Patent Document 1, the deviation of the position relative to the camera 108 has less effect on the mounting accuracy of the component-mounting apparatus 100. In addition, the component-mounting apparatus 100 can reduce (accelerate) mounting cycle time because it can check the component M held by the nozzle 102 while in motion.

The component-mounting apparatus described above, which requires equipment such as a camera and image-processing means, is disadvantageous because of its complicated structure and high cost.

In addition, the component-mounting apparatus allows limited acceleration because its positioning process involves the steps of taking an image of a component held by a nozzle, analyzing the image, and correcting the positional deviation of the component.

SUMMARY OF THE INVENTION

In light of the above circumstances, the present invention provides a component-mounting apparatus and a component-positioning unit for positioning a component which have a simple structure with reduced manufacturing cost and a significantly higher component-mounting speed.

A component-mounting apparatus according to one aspect of the invention includes holding means that holds a component and moves horizontally, and positioning means having a sloped portion for positioning the component held by the holding means when the component comes into contact with the sloped portion.

In such component-mounting apparatus the positioning means may include a first rotatable roller member having a sloped side surface with which the component comes into contact, and the horizontal movement speed of the holding means substantially agrees with the horizontal component of the peripheral velocity of the first roller member, with which the component comes into contact.

The positioning means may also include a first rotatable roller member having a sloped side surface with which the component comes into contact and an auxiliary roller member rotatably disposed opposite the first roller member and having a sloped side surface with which the component comes into contact.

In the component-mounting apparatus, the horizontal movement speed of the holding means substantially agrees with the horizontal component of the peripheral velocity of the first roller member and/or the auxiliary roller member, with which the component comes into contact.

In the component-mounting apparatus, the first roller member and/or the auxiliary roller member may have a first rotating shaft extending in a direction substantially perpendicular to the horizontal movement direction of the holding means.

Advantageously, the first roller member and the auxiliary roller member may share the single first rotating shaft.

According to another aspect of the invention, the component-mounting apparatus further includes control means for controlling the holding means and/or the first rotating shaft. The control unit controls at least either the holding means or the first rotating shaft so as to satisfy the equation $V=2\pi AN$ wherein V is the horizontal movement speed of the holding means; N is the number of revolutions of the first roller member and/or the auxiliary roller member; and A is the distance from the center of rotation of the first roller member and/or the auxiliary roller member to the conveying line of the holding means.

In such a component-mounting apparatus, a plurality of the first roller members and/or a plurality of the auxiliary roller members may be arranged in the movement direction of the holding means, and the holding means has a rotating portion that rotates with the component held about an axis substantially perpendicular to the movement direction of the holding means.

According another feature of the invention, the component-mounting apparatus further includes applying means for applying a paste material to the component. The applying means is disposed downstream of the first roller member and/or the auxiliary roller member in the movement direction of the component.

The applying means may include a second rotatable roller member having a circumferential surface provided with the paste material to apply the paste material to the component when the component comes into contact with the circumferential surface, and the horizontal movement speed of the holding means substantially agrees with the horizontal component of the peripheral velocity of the second roller member, with which the component comes into contact.

The second roller member may have a second rotating shaft extending in a direction substantially perpendicular to the horizontal movement direction of the holding means.

According to another aspect of the invention, a component-positioning unit for positioning a moving component includes a rotatable rotating shaft and a sloped side surface disposed at an end of the rotating shaft to position the moving component in the axial direction of the rotating shaft when the component comes into contact with the sloped side surface.

According to the features described above, the component is held and moved horizontally by the holding means and is mounted on another component.

When the holding means moves the component, the component is smoothly moved to a predetermined position along the sloped portion of the holding means. The component held by the holding means can therefore be positioned with increased mounting accuracy.

In addition, the component can be positioned only by bringing it into contact with the sloped portion of the holding means. The component-mounting apparatus can therefore achieve a simple structure with reduced manufacturing cost. Furthermore, the component can be positioned while being moved horizontally by the holding means. The component-mounting apparatus can therefore achieve a significantly increased component-mounting speed.

Moreover, the component is positioned when it comes into contact with the sloped side surface of the first roller member while being held by the holding means.

The horizontal movement speed of the holding means substantially agrees with the horizontal component of the peripheral velocity of the first roller member, with which the component comes into contact. Accordingly, the horizontal movement speed of the component can be reduced to substantially zero relative to the horizontal component of the peripheral velocity of the first roller member at the position of the sloped side surface where the component comes into contact therewith. When, therefore, the component comes into contact with the sloped side surface of the first roller member, the sloped side surface does not exert the torque of the first roller member on the component, thus preventing the positional deviation of the component.

Alternatively, the component held by the holding means is positioned when the component comes into contact with the sloped side surfaces of the first roller member and the auxiliary roller member. The component can therefore be positioned on both sides based on the movement direction of the component to achieve significantly increased component-mounting accuracy.

The horizontal movement speed of the holding means substantially agrees with the horizontal component of the peripheral velocity of the first roller member and/or the auxiliary roller member, with which the component comes into contact. Accordingly, the horizontal movement speed of the component can be reduced to substantially zero relative to the horizontal component of the peripheral velocity of the first roller member and/or the auxiliary roller member at the position of the sloped side surface where the component comes into contact therewith. When, therefore, the component comes into contact with the sloped side surface of the first roller member and/or the auxiliary roller member, the sloped side surface does not exert the torque of the first roller member and/or the auxiliary roller member on the component, thus preventing the positional deviation of the component.

Also, the first roller member and/or the auxiliary roller member has the first rotating shaft extending in the direction substantially perpendicular to the horizontal movement direction of the holding means. When, therefore, the first rotating shaft is rotated, the rotational direction of the first roller member and/or the auxiliary roller member can readily be allowed to agree with the movement direction of the component.

Further, the first roller member and the auxiliary roller member share the single first rotating shaft. This allows for a reduction in the number of parts used, a simplification of the component-mounting apparatus, and a reduction in the manufacturing cost of the component-mounting apparatus.

As described, the control unit controls at least either the holding means or the first rotating shaft so as to satisfy the equation $V=2\pi AN$ wherein V is the horizontal movement speed of the holding means; N is the number of revolutions of the first roller member and/or the auxiliary roller member; and A is the distance from the center of rotation of the first roller member and/or the auxiliary roller member to the conveying line of the holding means. As a result, the horizontal movement speed of the holding means can readily be allowed to agree with the horizontal component of the peripheral velocity of the first roller member and/or the auxiliary roller member, with which the component comes into contact.

Moreover, the component held by the holding means is positioned by one first roller member and/or one auxiliary roller member and is rotated substantially 90° together with the rotating portion. The component is then positioned again when it comes into contact with the sloped side surface of another first roller member and/or another auxiliary roller member. As a result, the component can be positioned not only in the direction (horizontal direction) perpendicular to the movement direction of the holding means, but also in the movement direction of the holding means.

The applying means for applying the paste material to the component is disposed downstream of the first roller member and/or the auxiliary roller member in the movement direction of the component. The paste material can therefore be applied to the component after the positioning. This increases the positional accuracy with which the paste material is applied to the component.

Also as described, the horizontal movement speed of the holding means substantially agrees with the horizontal component of the peripheral velocity of the second roller member, with which the component comes into contact. Accordingly, the speed of the component can be reduced to substantially zero relative to the second roller member. This prevents the positional deviation of the component when it comes into contact with the second roller member in the application of the paste material.

Further, the second roller member has the second rotating shaft extending in the direction substantially perpendicular to the horizontal movement direction of the holding means. When, therefore, the second rotating shaft is rotated, the rotational direction of the second roller member can readily be allowed to agree with the movement direction of the component.

Moreover, the moving component is positioned in the axial direction of the rotating shaft when the component comes into contact with the sloped side surface. When used in a component-mounting apparatus, therefore, the component-positioning unit enables the mounting of the component with increased mounting accuracy.

In addition, the component can be positioned only by bringing it into contact with the sloped side surface. The component-positioning unit can therefore simplify the structure of a component-mounting apparatus and reduce its manufacturing cost. Furthermore, the component can be positioned while being moved. When used in a component-mounting apparatus, therefore, the component-positioning unit can significantly increase the component-mounting speed of the apparatus.

Other features and advantages of the present invention will become apparent from the following description of embodiments of invention which refers to the accompanying drawings.

DETAILED DESCRIPTION OF EMBODIMENTS OF THE INVENTION

A component-mounting apparatus according to a first embodiment of the present invention will now be described with reference to the drawings.

Figure 1:
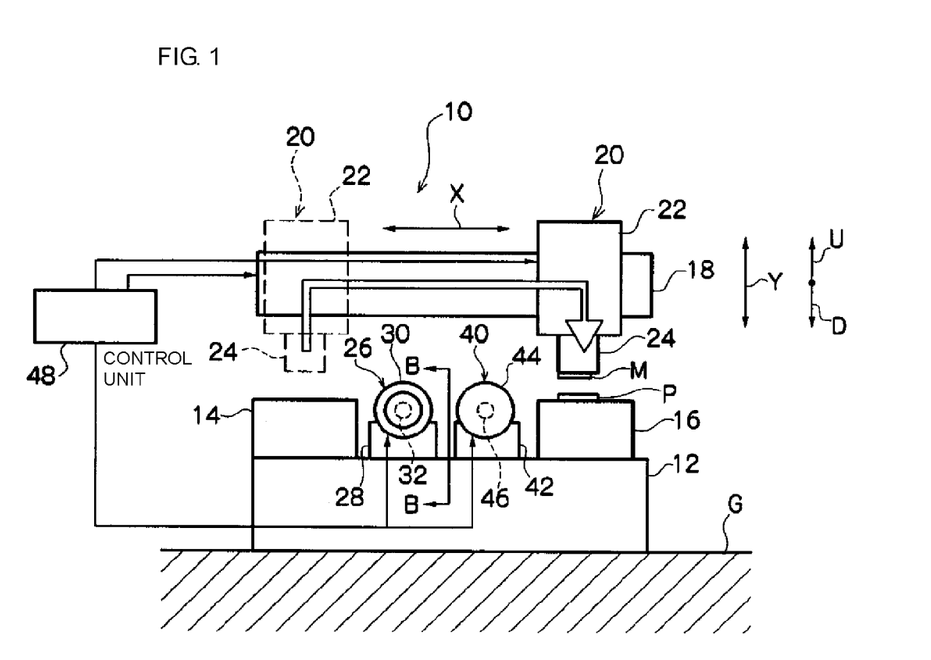
FIG. 1 is a schematic diagram of a component-mounting apparatus according to a first embodiment of the present invention.
Figure 2:
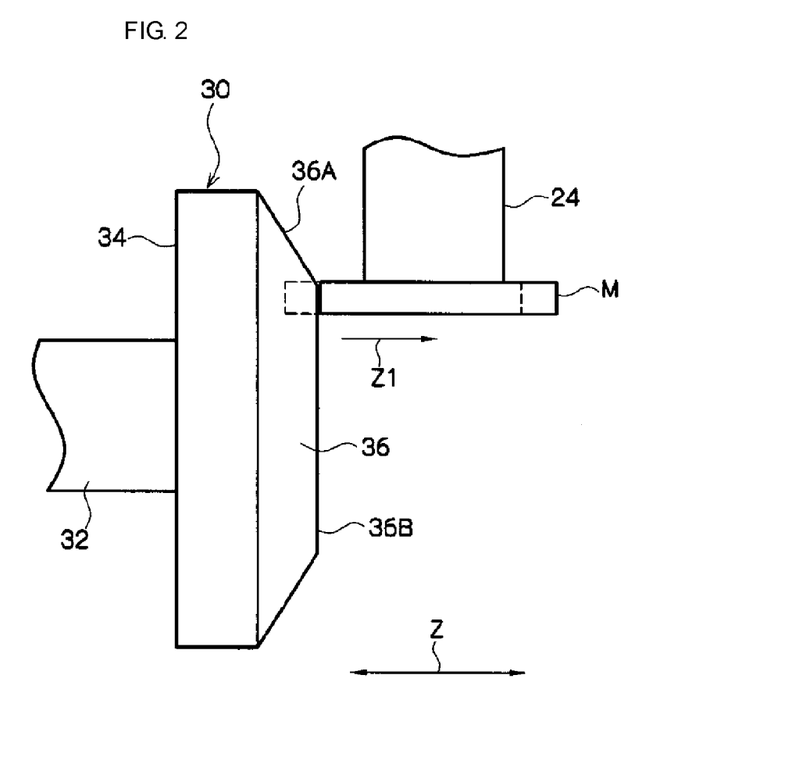
FIG. 2 is a view in a direction indicated by arrow B-B in FIG. 1.

Referring to FIGS. 1 and 2, a component-mounting apparatus 10 according to this embodiment includes a base 12 fixed on a floor G and a component supply stage 14 and a placement stage 16 disposed on the top surface of the base 12. An electronic component (component) M is supplied to the top surface of the component supply stage 14 by, for example, component supply means (not shown) while another electronic component P on which the electronic component M is mounted is placed on the placement stage 16 by, for example, component placement means (not shown).

A drive shaft 18 is provided above the base 12, extending from near the component supply stage 14 to near the placement stage 16. A suction head (holding means) 20 is attached to the drive shaft 18 movably in the axial direction (in the horizontal direction, indicated by the arrow X in FIG. 1). As the drive shaft 18 rotates, the suction head 20 can move along the drive shaft 18 horizontally. The suction head 20 can also move in a direction substantially perpendicular to the axial direction of the drive shaft 18 (in the vertical direction, indicated by the arrow Y in FIG. 1). The suction head 20 includes a head body 22 that moves along the drive shaft 18 in the horizontal direction (indicated by the arrow X in FIG. 1) and a suction nozzle 24 attached to the head body 22 to hold the electronic component M by suction. A suction hose (not shown) is attached to the head body 22 with an end thereof connected to the suction nozzle 24. The suction nozzle 24 can hold the electronic component M through the suction of air with an external suction pump (not shown) connected to the other end of the suction hose.

In this embodiment, the suction head 20 can move horizontally as the drive shaft 18 rotates, though the present invention is not limited to the above structure; the component-mounting apparatus 10 may also be configured so that the suction head 20 can move along a drive shaft 18 that does not rotate.

A positioning roller unit 26 is disposed between the component supply stage 14 and the component placement stage 16 on the top surface of the base 12. This positioning roller unit 26 includes a first support member 28, a first rotating shaft 32 rotatably attached to the first support member 28, and a first roller member 30 attached to the first rotating shaft 32. The first rotating shaft 32 is disposed such that the axial direction thereof is substantially perpendicular to the axial direction of the drive shaft 18 (the direction indicated by the arrow Z in FIG. 2). The first roller member 30, which rotates as the first rotating shaft 32 rotates, includes a cylindrical roller body 34 and a positioning portion 36 integrally formed with the roller body 34 and having a sloped side surface 36A and a flat surface 36B continuous with the sloped side surface 36A.

An applying roller unit 40 for applying a paste material (for example, an adhesive) to the electronic component M held by the suction nozzle 24 is detachably disposed near the positioning roller unit 26. This applying roller unit 40 includes a second support member 42, a second rotating shaft 46 rotatably attached to the second support member 42, and a second roller member 44 attached to the second rotating shaft 46. The second rotating shaft 46 is disposed such that the axial direction thereof is substantially perpendicular to the axial direction of the drive shaft 18 (the direction indicated by the arrow Z in FIG. 2). The second roller member 44 is a cylindrical roller that rotates as the second rotating shaft 46 rotates.

The applying roller unit 40 is optionally provided according to need; if unnecessary, it may be detached from the component-mounting apparatus 10.

The component-mounting apparatus 10 further includes a control unit (control means) 48 for controlling the rotation of the drive shaft 18 (the horizontal movement of the suction head 20), the vertical movement of the suction head 20, and the rotation of the first rotating shaft 32 and the second rotating shaft 46.

Next, the operation of the component-mounting apparatus 10 according to this embodiment will now be described.

Referring to FIGS. 1 to 5, the electronic component M is supplied to the top surface of the component supply stage 14 by the component supply means (not shown). After the electronic component M is supplied to the component supply stage 14, the control unit 48 controls the suction head 20 to move the suction head 20 downward (in the direction indicated by the arrow D in FIG. 1). The suction pump (not shown) is then operated so that the suction nozzle 24 picks up the electronic component M by the suction of air through the suction hose (not shown).

The suction force of the suction nozzle 24, as described later, is adjusted so that the electronic component M can come into contact with the sloped side surface 36A of the first roller member 30 to move relative to the suction nozzle 24 in a positioning direction without falling from the suction nozzle 24.

After the suction head 20 picks up the electronic component M by suction, the control unit 48 controls the suction head 20 to move it upward (in the direction indicated by the arrow U in FIG. 1) and then move it horizontally, as described below.

Figure 4A:
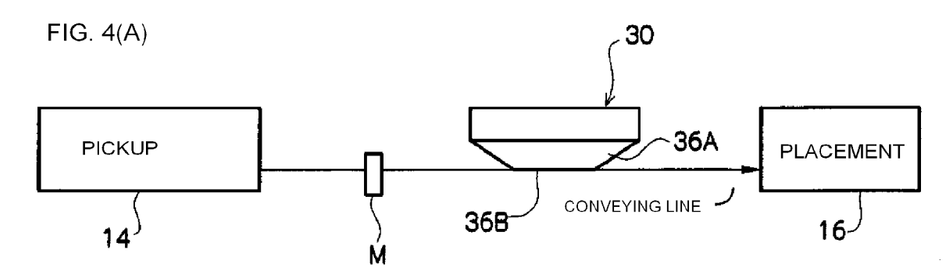
FIG. 4(A) is a top view of the component-mounting apparatus according to the first embodiment of the present invention, showing the positioning of a component.
Figure 4B:
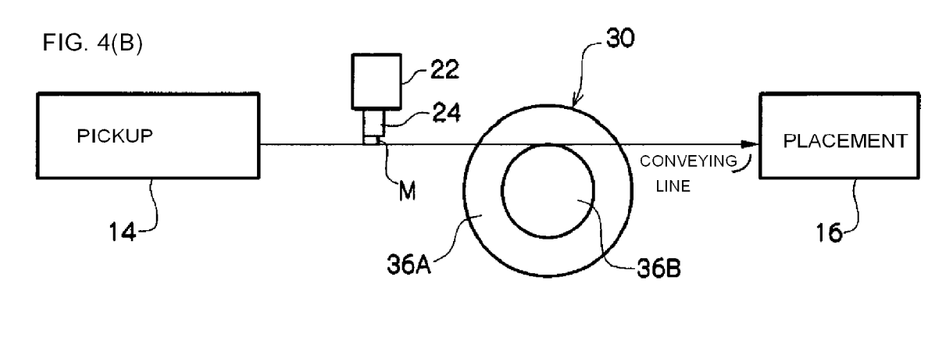
FIG. 4(B) is a side view of the component-mounting apparatus according to the first embodiment of the present invention, showing the positioning of the component.

Referring to FIGS. 4(A) and 4(B), the suction nozzle 24 holding the electronic component M by suction moves horizontally (in the direction indicated by the arrow X in FIG. 1) toward the component placement stage 16 as the control unit 48 rotates the drive shaft 18. As the suction nozzle 24 holding the electronic component M by suction moves horizontally, the electronic component M is conveyed horizontally to enter the region of the sloped side surface 36A of the positioning portion 36. The electronic component M then comes into contact with the sloped side surface 36A and moves along the slope thereof in a predetermined direction (in the direction indicated by the arrow Z1 in FIG. 2). Subsequently, the electronic component M enters the region of the flat surface 36B and comes into contact with the flat surface 36B, which determines the position of the electronic component M. The electronic component M then exits the region of the flat surface 36B, enters the region of the sloped side surface 36A again, and exits the region of the sloped side surface 36A.

The electronic component M can thus be positioned simply by bringing it into contact with the sloped side surface 36A of the first roller member 30. Accordingly, the component-mounting apparatus 10 can achieve a simple structure with reduced manufacturing cost.

In addition, the electronic component M can be positioned while being moved (conveyed) horizontally by the suction head 20. The component-mounting apparatus 10 can therefore achieve a significantly increased component-mounting speed.

Furthermore, the component-mounting apparatus 10 does not require equipment such as a camera and image-processing means, unlike the known component-mounting apparatus 100 (see FIG. 8). The component-mounting apparatus 10 can therefore achieve a simple structure with reduced manufacturing cost.

The control unit 48 controls at least either the drive shaft 18 or the first rotating shaft 32 so that the horizontal movement speed of the electronic component M (the horizontal movement speed of the suction head 20) is substantially equal to the horizontal component of the peripheral velocity of the first roller member 30 (the first rotating shaft 32) at a position where the electronic component M comes into contact with the first roller member 30.

Figure 3:
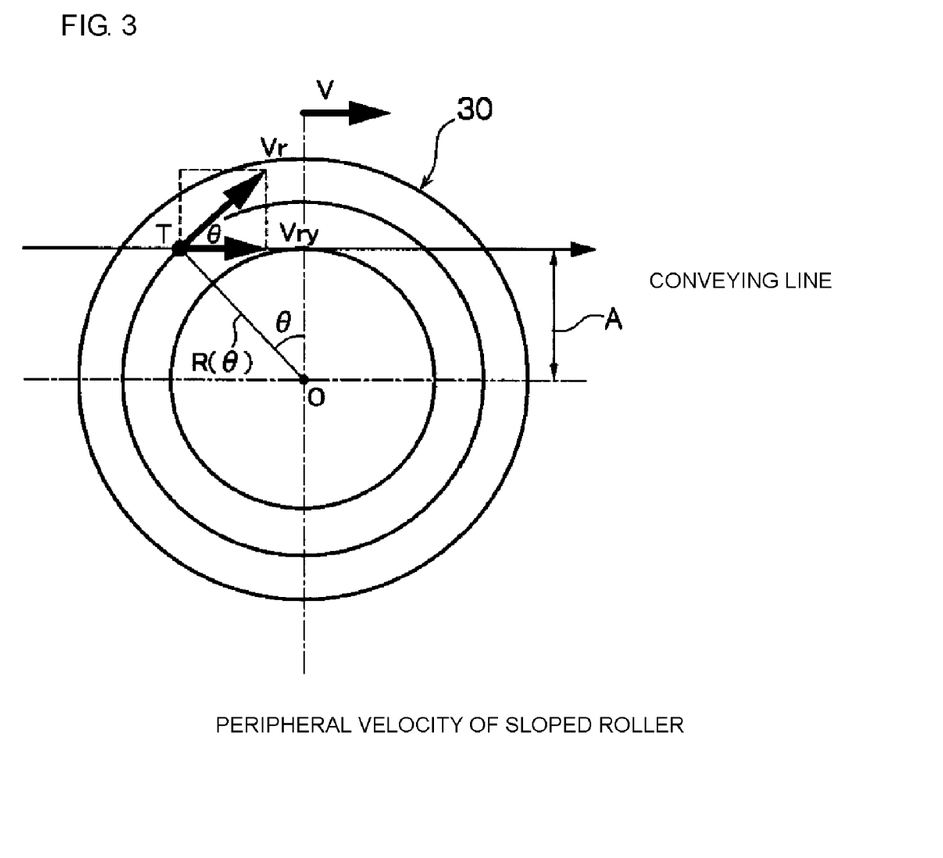
FIG. 3 is a diagram illustrating the peripheral velocity of positioning means included in the component-mounting apparatus according to the first embodiment of the present invention.

Referring to FIG. 3, specifically, the distance $R(\theta)$ from the center of rotation of the first roller member 30 to a point T (on the conveying line) where the electronic component M comes into contact with the sloped side surface 36A is represented by the following equation (1):

$$R(\theta) = A/\cos \theta \quad (1)$$

wherein A is the minimum distance from the center of rotation of the first roller member 30 to the conveying line of the electronic component M.

Hence, the peripheral velocity Vr of the first roller member 30 at the point T (on the conveying line) where the electronic component M comes into contact with the sloped side surface 36A is represented by the following equation (2):

$$Vr = 2\pi R(\theta) \cdot N = 2\pi AN/\cos \theta \quad (2)$$

wherein N is the number of revolutions of the first roller member 30.

The horizontal component Vry of the peripheral velocity Vr is represented by the following equation (3):

$$Vry = Vr \cdot \cos \theta \quad (3)$$

Combining the equations (2) and (3) yields the following equation:

$$Vry = 2\pi AN/(\cos \theta) \cdot \cos \theta = 2\pi AN$$

Accordingly, the suction head 20 (the drive shaft 18) and/or the first roller member 30 (the first rotating shaft 32) may be controlled by the control unit 48 so that the speed V at which the electronic component M is conveyed is $2\pi AN$. This allows the horizontal movement speed of the suction head 20 (the electronic component M) to agree with the horizontal component of the peripheral velocity of the first roller member 30 at any position where the electronic component M comes into contact with the sloped side surface 36A of the first roller member 30. The horizontal movement speed of the electronic component M can therefore be reduced to substantially zero relative to the horizontal component of the peripheral velocity of the first roller member 30 at the position where the electronic component M comes into contact with the sloped side surface 36A of the first roller member 30. When, therefore, the electronic component M comes into contact with the sloped side surface 36A of the first roller member 30, the sloped side surface 36A does not exert the torque of the first roller member 30 on the electronic component M, thus preventing the positional deviation of the electronic component M.

A plurality of suction heads 20 may be provided on the drive shaft 18. In this case, the single first roller member 30 can position electronic components M with high positioning accuracy without causing positional variations between the electronic components.

Figure 5:
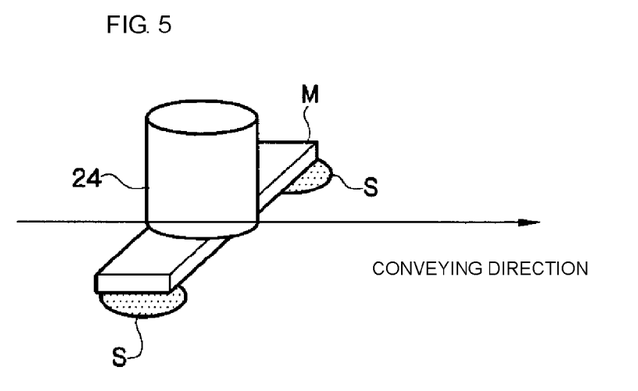
FIG. 5 is a perspective view of an electronic component being conveyed by the component-mounting apparatus according to the first embodiment of the present invention.

After the positioning by the first roller member 30, the electronic component M is conveyed horizontally (in the direction indicated by the arrow X in FIG. 1) while being held by the suction of the suction head 20. The electronic component M then comes into contact with the circumferential surface of the second roller member 44, which applies a paste material S provided in advance on the circumferential surface thereof to the electronic component M, as shown in FIG. 5. The second roller member 44 can apply the paste material S to the electronic component M with high positional accuracy because the electronic component M has already been positioned.

The control unit 48 controls the second rotating shaft 46 so that the peripheral velocity of the second roller member 44 is substantially equal to the speed V at which the electronic component M is conveyed. Accordingly, the speed of the electronic component M is substantially zero relative to the second roller member 44. When, therefore, the electronic component M comes into contact with the circumferential surface of the second roller member 44, the circumferential surface does not exert the torque of the second roller member 44 on the electronic component M. As a result, the component-mounting apparatus 10 can prevent the positional deviation of the electronic component M positioned by the first roller member 30 when the electronic component M comes into contact with the second roller member 44 in the application of the paste material S. In addition, the component-mounting apparatus 10 causes no loss of time until the mounting of the electronic component M because the second roller member 44 applies the paste material S to the electronic component M while the component is being conveyed.

After the positioning of the electronic component M and the application of the paste material S thereto, the electronic component M is mounted on the other electronic component P placed on the placement stage 16. The electronic component M can be mounted on the other electronic component P with significantly increased mounting accuracy because the electronic component M has been positioned in advance.

Next, a component-mounting apparatus according to a second embodiment of the present invention will be described.

Parts identical to those of the component-mounting apparatus according to the first embodiment are indicated by the same reference numerals, and the description thereof is omitted.

Figure 6:
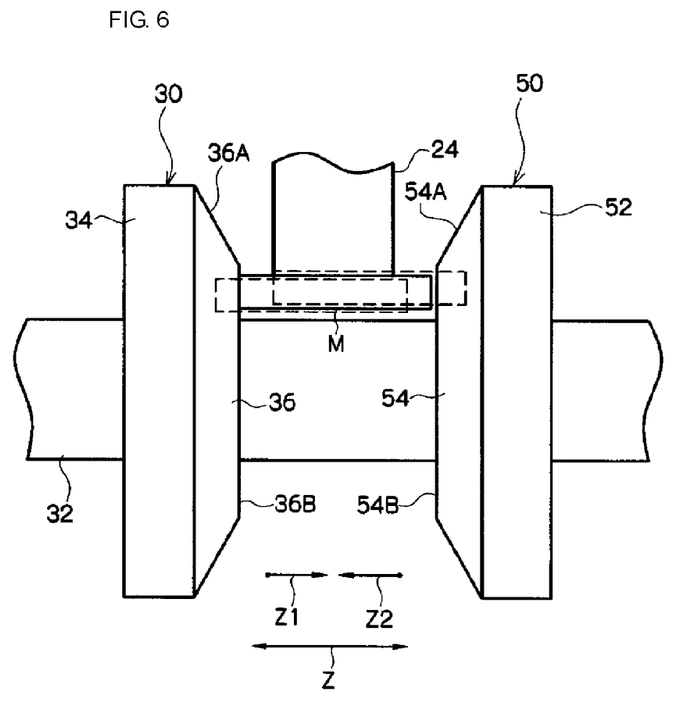
FIG. 6 is a schematic diagram of positioning means included in a component-mounting apparatus according to a second embodiment of the present invention.

For the component-mounting apparatus according to this embodiment, as shown in FIG. 6, the first rotating shaft 32 of the component-mounting apparatus 10 according to the first embodiment penetrates the first roller member 30, and an auxiliary roller member 50 is attached to the first rotating shaft 30 so as to face the first roller member 30.

The auxiliary roller member 50, which is similar to the first roller member 30, includes a cylindrical roller body 52 and a positioning portion 54 integrally formed with the roller body 52 and having a sloped side surface 54A and a flat surface 54B continuous with the sloped side surface 54A.

Thus, in the component-mounting apparatus according to this embodiment, the first roller member 30 and the auxiliary roller member 50 are disposed on the first rotating shaft 32 such that the positioning portions 36 and 54 thereof face each other.

For the component-mounting apparatus according to this embodiment, the electronic component M comes into contact with at least either the sloped side surface 36A of the first roller member 30 or the sloped side surface 54A of the auxiliary roller member 50 and is positioned with respect to both sides of the conveying line (indicated by the arrows Z1 and Z2 in FIG. 6). The component-mounting apparatus can therefore position the electronic component M with significantly increased positioning accuracy.

In addition, the component-mounting apparatus can achieve reductions in the number of parts used and manufacturing cost because the first roller member 30 and the auxiliary roller member 50 share the first rotating shaft 32. However, if desired, the auxiliary roller member 50 could be mounted on a separate rotating shaft (not shown).

Next, a component-mounting apparatus according to a third embodiment of the present invention is described below.

Parts identical to those of the component-mounting apparatus according to the first embodiment are indicated by the same reference numerals, and the description thereof is omitted.

Figure 7:
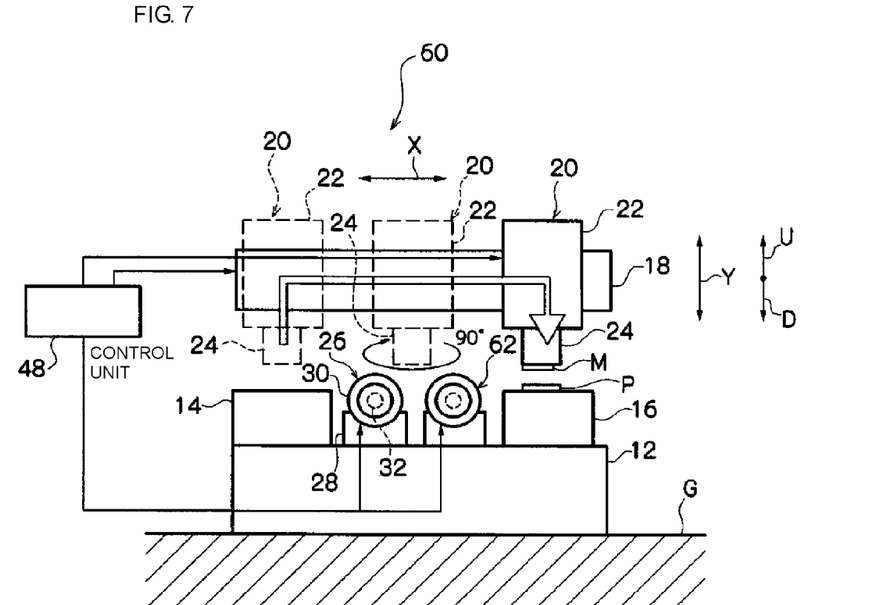
FIG. 7 is a schematic diagram of a component-mounting apparatus according to a third embodiment of the present invention.

For a component-mounting apparatus 60 according to this embodiment, as shown in FIG. 7, the suction nozzle (rotating portion) 24 is rotatable with respect to the head body 22. Specifically, the suction nozzle 24 is attached to a rotating shaft (not shown) rotatably attached to the head body 22 so as to extend in a direction (indicated by the arrow Y in FIG. 7) substantially perpendicular to the axial direction (indicated by the arrow X in FIG. 7) of the drive shaft 18. Accordingly, the suction nozzle 24 can rotate with the rotating shaft (not shown), which is controlled by the control unit 48.

A plurality of positioning roller units are arranged on the base 12 in the axial direction of the drive shaft 18; that is, in this example, another positioning roller unit 62 is provided downstream of the positioning roller unit 26 in the direction in which the electronic component M is conveyed.

The positioning roller unit 62 newly provided in the component-mounting apparatus 60 according to this embodiment is similar to the positioning roller unit 26 provided in the component-mounting apparatus 10 according to the first embodiment, and thus the detailed description of the positioning roller unit 62 is omitted.

The applying roller unit 40 (see FIG. 1), which is not provided in the component-mounting apparatus according to this embodiment, may be provided downstream of the positioning roller unit 30 in the direction in which the electronic component M is conveyed, as in the component-mounting apparatus 10 according to the first embodiment.

For the component-mounting apparatus 60 according to this embodiment, the first roller member 30 of the positioning roller unit 26 positions the electronic component M in a direction perpendicular to the conveying direction, and the control unit 48 then rotates the rotating shaft (not shown) of the suction head 20 about 90° to rotate the electronic component M held by the suction of the suction nozzle 24 about 90°.

The component-mounting apparatus 60 causes no loss of time because the rotating shaft is rotated while the suction head 20 is moving horizontally.

After being rotated about 90°, the electronic component M held by the suction of the suction nozzle 24 is conveyed horizontally and is positioned in the direction perpendicular to the conveying direction by the positioning roller unit 62. The electronic component M can thus be positioned by the two positioning roller units 26 and 62 to achieve even higher positioning accuracy which leads to significantly increased mounting accuracy.

The applying roller unit 40 may optionally be provided, as in the component-mounting apparatus 10 according to the first embodiment, and the auxiliary roller member 50 may optionally be provided, as in the component-mounting apparatus according to the second embodiment.

Although the present invention has been described in relation to particular embodiments thereof, many other variations and modifications and other uses will become apparent to those skilled in the art. Therefore, the present invention is not limited by the specific disclosure herein.

What is claimed is:

1. A component-mounting apparatus comprising:
a holding device for holding a component while moving horizontally; and
a positioning device having a sloped portion for engaging and positioning the component held by the holding device when the holding device brings the component into contact with the sloped portion; wherein
the positioning device comprises a first rotatable roller member having a sloped side surface with which the component comes into contact;
the horizontal movement speed of the holding device substantially agrees with the horizontal component of the peripheral velocity of the first roller member, with which the component comes into contact; and
wherein the first roller member has a first rotating shaft extending in a direction substantially perpendicular to the horizontal movement direction of the holding device.

2. The component-mounting apparatus according to claim 1, further comprising a control device for controlling at least one of the holding device and the first rotating shaft, wherein the control unit controls at least either the holding device or the first rotating shaft so as to satisfy the following equation:

$$V = 2\pi A N$$

wherein V is the horizontal movement speed of the holding device; N is the number of revolutions of the first roller member; and A is the distance from the center of rotation of the first roller member to the conveying line of the holding means.

3. The component-mounting apparatus according to claim 1, further comprising an applying device for applying a paste material to the component, the applying device being disposed downstream of the first roller member in the movement direction of the component.

4. The component-mounting apparatus according to claim 3, wherein the applying device comprises a second rotatable roller member having a circumferential surface provided with the paste material to apply the paste material to the component when the component comes into contact with the circumferential surface; and the horizontal movement speed of the holding device substantially agrees with the horizontal component of the peripheral velocity of the second roller member, with which the component comes into contact.

5. The component-mounting apparatus according to claim 4, wherein the second roller member has a second rotating shaft extending in a direction substantially perpendicular to the horizontal movement direction of the holding device.

* * * * *